United States Patent
Wood et al.

[11] Patent Number: 6,107,122
[45] Date of Patent: Aug. 22, 2000

[54] DIRECT DIE CONTACT (DDC) SEMICONDUCTOR PACKAGE

[75] Inventors: Alan G. Wood, Boise; Warren M. Farnworth, Nampa; Ford Grigg, Meridian; Salman Akram, Boise, all of Id.

[73] Assignee: Micron Technology, Inc., Boise, Id.

[21] Appl. No.: 08/905,602

[22] Filed: Aug. 4, 1997

[51] Int. Cl.[7] .................................................... H01R 9/09
[52] U.S. Cl. ........................ 438/117; 438/119; 438/613; 439/81; 439/630; 439/876
[58] Field of Search .................................. 438/615, 612, 438/613, 106, 108, 117, 119, 455; 257/737, 679, 684, 778, 777; 439/62, 81, 326, 630, 876

[56] References Cited

U.S. PATENT DOCUMENTS

| | | | |
|---|---|---|---|
| 3,650,450 | 3/1972 | Larson et al. ............................... | 228/46 |
| 3,809,625 | 5/1974 | Brown et al. ............................... | 204/15 |
| 4,188,417 | 2/1980 | Lichtenberg ............................... | 427/229 |
| 4,316,208 | 2/1982 | Kobayashi et al. ....................... | 357/55 |
| 4,661,375 | 4/1987 | Thomas .................................... | 427/89 |
| 4,840,820 | 6/1989 | Schultz et al. . | |
| 4,927,505 | 5/1990 | Sharma et al. ........................... | 204/34.5 |
| 4,970,571 | 11/1990 | Yamakawa et al. ...................... | 357/71 |
| 5,104,324 | 4/1992 | Grabbe et al. ............................ | 439/62 |
| 5,169,680 | 12/1992 | Ting et al. ................................. | 427/96 |
| 5,249,450 | 10/1993 | Wood et al. .............................. | 72/359 |
| 5,259,793 | 11/1993 | Yamada et al. .......................... | 439/637 |
| 5,269,453 | 12/1993 | Melton et al. ....................... | 228/180.22 |
| 5,308,796 | 5/1994 | Feldman et al. ......................... | 437/200 |
| 5,341,564 | 8/1994 | Akhavian et al. ........................ | 29/832 |
| 5,367,196 | 11/1994 | Mahulikar et al. ...................... | 257/787 |
| 5,376,584 | 12/1994 | Agarwala ................................. | 437/183 |
| 5,461,261 | 10/1995 | Nishiguchi ............................... | 257/781 |
| 5,483,741 | 1/1996 | Akram et al. ............................ | 29/846 |
| 5,519,332 | 5/1996 | Wood et al. .............................. | 324/755 |
| 5,531,021 | 7/1996 | Kolman et al. .......................... | 29/843 |
| 5,531,942 | 7/1996 | Gilleo et al. ............................. | 264/5 |
| 5,532,612 | 7/1996 | Liang ....................................... | 324/760 |
| 5,547,740 | 8/1996 | Higdon et al. ........................... | 428/209 |
| 5,559,444 | 9/1996 | Farnworth et al. ...................... | 324/754 |
| 5,578,526 | 11/1996 | Akram et al. ............................ | 438/209 |
| 5,592,736 | 1/1997 | Akram et al. ............................ | 29/842 |
| 5,593,927 | 1/1997 | Farnworth et al. ...................... | 437/209 |
| 5,617,990 | 4/1997 | Thompson, Sr. . | |
| 5,633,122 | 5/1997 | Tuttle . | |

(List continued on next page.)

OTHER PUBLICATIONS

Tummala, Rao R., Microelectronics Packaging Handbook, Van Norstrand Reinhold, pp. 336–381, 1989.
Tummula, Rao R., *Microelectronics Packaging Handbook*, Van Nostrand Reinhold, pp. 366–381, 1989.
Suss Report, Lorenz H. et al., vol. 10, Third/Fourth Quarter 1996, technical paper.

*Primary Examiner*—Wael Fahmy
*Assistant Examiner*—Kurt Eaton
*Attorney, Agent, or Firm*—Stephen A. Gratton

[57] ABSTRACT

A semiconductor package and method for fabricating the package are provided. The package includes a housing having individual channels, each adapted to retain a semiconductor die in electrical communication with electrical connectors. The dice can include solder bumps, formed on electrodes, using electroless deposition and wave soldering. For fabricating the package, the dice can be inserted into the channels, with the electrical connectors on the housing proximate to the solder bumps on the dice. The solder bumps can then be reflowed to form bonded connections with the electrical connectors. In an alternate embodiment, conductive adhesive bumps, rather than solder bumps, are formed on the dice to provide compliant connections with the electrical connectors on the housing. In addition, the conductive adhesive bumps can be cured while in contact with the electrical connectors to form bonded connections. Other alternate embodiments include a chip scale package, a temporary package for testing bare dice, and a multi chip module.

20 Claims, 5 Drawing Sheets

U.S. PATENT DOCUMENTS

| | | | |
|---|---|---|---|
| 5,674,785 | 10/1997 | Akram et al. | 438/217 |
| 5,675,889 | 10/1997 | Acocella et al. | |
| 5,736,456 | 4/1998 | Akram | 438/614 |
| 5,789,278 | 8/1998 | Akram et al. | 438/118 |
| 5,795,619 | 8/1998 | Lin et al. | |
| 5,851,911 | 12/1998 | Farnworth | |
| 5,872,400 | 2/1999 | Chapman et al. | 257/738 |
| 5,888,849 | 3/1999 | Johnson | 438/126 |
| 5,889,327 | 3/1999 | Washida et al. | 257/737 |
| 5,903,058 | 5/1999 | Akram | 257/778 |
| 5,910,640 | 6/1999 | Farnworth et al. | 174/50 |

PROVIDING A SEMICONDUCTOR DIE
HAVING METAL ELECTRODES, STEP A.

CLEANING AND ACTIVATING THE METAL ELECTRODES FOR
SUBSEQUENT ELECTROLESS DEPOSITION, STEP B.

ELECTROLESSLY DEPOSITING ADHERENCE LAYERS ON
THE ACTIVATED METAL ELECTRODES, STEP C.

ELECTROLESSLY DEPOSITING SOLDER WETTABLE
LAYERS ON THE ADHERENCE LAYERS, STEP D.

DEPOSITING SOLDER BUMPS ON THE SOLDER WETTABLE LAYERS
USING A WAVE SOLDERING APPARATUS, STEP E.

FIGURE 4

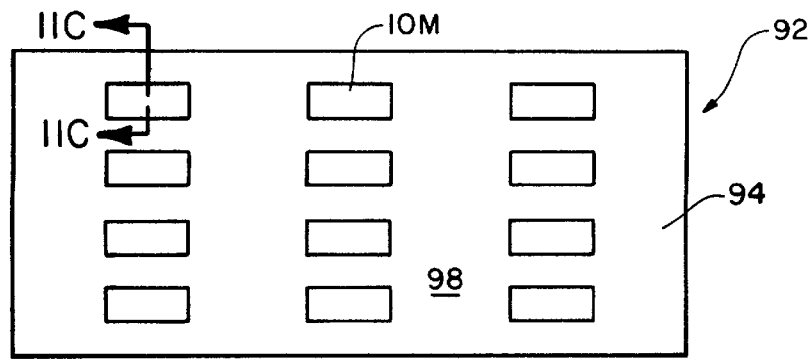
FIGURE 11
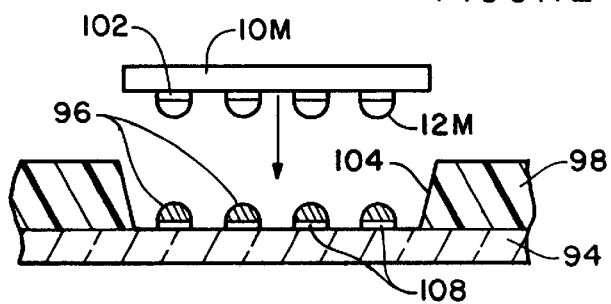
FIGURE 11A
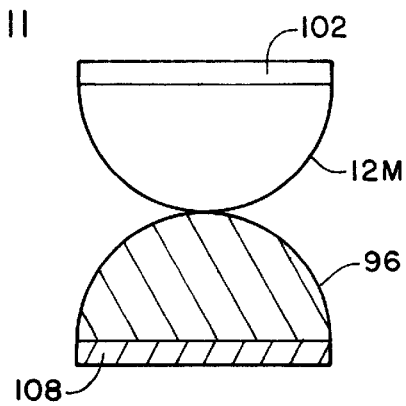
FIGURE 11D
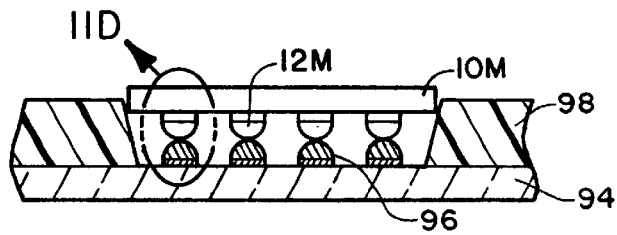
FIGURE 11B
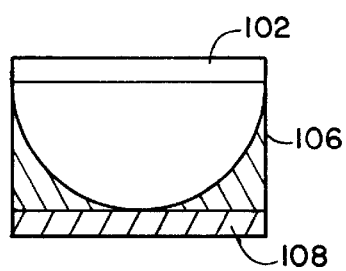
FIGURE 11E
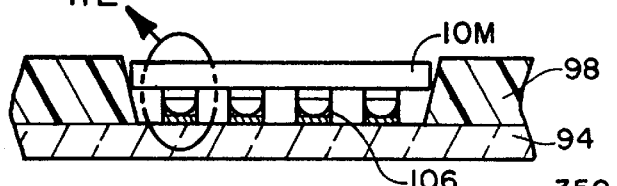
FIGURE 11C
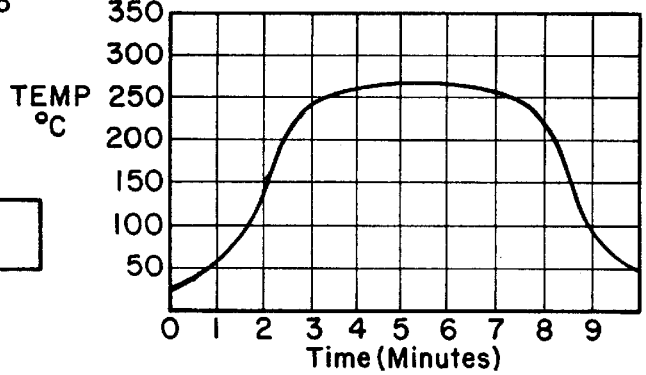
FIGURE 12A
FIGURE 12B

DIRECT DIE CONTACT (DDC) SEMICONDUCTOR PACKAGE

FIELD OF THE INVENTION

This invention relates generally to semiconductor manufacture, and more particularly to improved packages and packaging methods for semiconductor dice.

BACKGROUND OF THE INVENTION

One type of semiconductor package is referred to as a multi chip module. A typical multi chip module includes a substrate having an interconnect pattern for mounting one or more bare dice. A cover or encapsulant can also be formed on the substrate for protecting the dice. Different techniques can be used for mounting the dice to the substrate, and for providing electrical interconnection and termination of the dice. These techniques include wirebonding, tape automated bonding (TAB), micro-bump bonding, and flip chip bonding.

Multi chip modules can also be fabricated using packages adapted to contain and electrically contact bare dice. One type of package used to form multi chip modules is referred to as a connector. A connector can include a housing with individual channels for receiving the dice, and spring contacts for electrically contacting the bond pads on the dice. Typically the dice include bond pads formed along one edge. Dice having bond pad configurations configured for this type of packaging are sometimes referred to as a direct die contact (DDC) dice.

A representative connector is available from AMP Inc. of Harrisburg, Pa., and is described in U.S. Pat. No. 5,104,324 to Grabbe et al. entitled "Multi Chip Module Connector". With this type of connector, the dice are slid into channels into physical contact with spring contacts. The spring contacts scrub the surfaces of the device bond pads to penetrate electrically insulating native oxide layers, and contact the underlying metal.

One problem with this type of connector is that the quality of the electrical connections with the device bond pads is dependent on contact forces developed by the spring contacts. If the contact forces aren't sufficiently high, reliable electrical contacts cannot be achieved. However, the spring contacts can also exert too much force and damage the dice. The bond pads and passivation layer of a (DDC) die are particularly susceptible to damage during insertion into the separate channels of the connector. In a similar manner the dice cannot be removed from the housing without damage.

Another problem with this type of connector, is "misalignment" occurring between the spring contacts and bond pads. In particular, flexing and binding of the spring contacts can cause misalignment with the bond pads. Another problem, referred to as "fretting", can occur if the spring contacts move or vibrate with respect to the bond pads. Misalignment and fretting can affect the quality of the electrical connections and cause damage to the dice.

In view of the foregoing improved direct die contact (DDC) semiconductor packages are needed.

SUMMARY OF THE INVENTION

In accordance with the present invention, improved semiconductor packages and packaging methods are provided. Also provided are an improved DDC die, and an improved method for fabricating DDC dice. In an illustrative embodiment a package includes a housing with individual channels, each adapted to retain a single DDC die. The DDC dice include raised contacts configured for direct bonding to electrical connectors formed within the channels. In the illustrative embodiment, the raised contacts on the DDC dice comprise solder bumps, and the electrical connectors on the housing comprise spring contacts.

For fabricating the package, the DDC dice can be inserted into the individual channels on the housing, and the solder bumps on the dice reflowed to form bonded connections with the electrical connectors. The bonded connections prevent movement of the DDC dice and electrical connectors. In addition, the bonded connections permit the electrical connectors on the housing to be shaped to allow placement of the dice into the individual channels without damage. Disassembly of the package can also be performed by heating the solder bumps and removing the dice from the individual channels.

A method for fabricating the DDC die with raised contacts includes electroless deposition and wave soldering. Initially, conventional dice can be provided with metal electrodes, such as bond pads, in a conventional configuration. Alternately, conventional bond pad configurations can be modified with additional metallization to form custom electrodes of a desired size, shape and pattern. Next, adhesion layers and solder wettable layers can be electrolessly deposited onto the electrodes. Lastly, a wave soldering apparatus can be used to deposit the solder bumps on the solder wettable layers.

In an alternate embodiment package, the raised contacts comprise conductive adhesive bumps configured to electrically contact the electrical connectors on the housing. The conductive adhesive bumps can be a resilient material to provide compliancy during engagement with the electrical connectors. The conductive adhesive bumps can also be inserted into the channels in a semi cured, or B-stage condition, and then fully cured under compression to form bonded connections.

In another alternate embodiment package, the DDC die can be bonded to a ball grid array (BGA) substrate to form a chip scale package. In yet another alternate embodiment package, the method can be used to form solder bumps on an interconnect component for a temporary package adapted to test bare semiconductor dice.

In still another alternate embodiment, DDC dice fabricated in accordance with the method of the invention can be flip chip mounted to a substrate, such as a printed circuit board (PCB), to form a multi chip module. In this embodiment the substrate can include bumped electrodes, and an alignment fence configured to mechanically align the solder bumps to the bumped electrodes. A solder reflow can then be employed to bond the solder bumps to the bumped electrodes.

BRIEF DESCRIPTION OF THE DRAWINGS

FIG. 4 is a block diagram illustrating a method for fabricating a direct die connect (DDC) die in accordance with the invention;

FIG. 11 is a plan view of a multi chip module constructed in accordance with the invention;

FIG. 11A–C are schematic cross sectional view illustrating an assembly sequence for the multi chip module of FIG. 11;

FIG. 11D is an enlarged cross sectional view taken along section line 11D—11D of FIG. 11B;

FIG. 11E is an enlarged cross sectional view taken along section line 11E—11E of FIG. 11C;

FIG. 12A is a schematic diagram of a conveyor furnace suitable for performing a reflow step of the assembly sequence of FIGS. 11A–C; and FIG. 12B is a temperature vs. time profile of a representative reflow step.

DETAILED DESCRIPTION OF THE PREFERRED EMBODIMENTS

Figure 1:
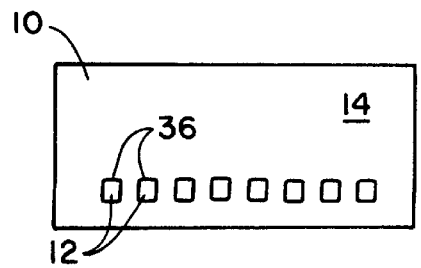
FIG. 1 is a schematic plan view of a direct die connect (DDC) die constructed in accordance with the invention.

Referring to FIG. 1, a direct die connect (DDC) die 10 constructed in accordance with the invention includes a pattern of solder bumps 12 formed on a face of the die 10. The solder bumps 12 are located on metal electrodes 36 embedded in a passivation layer 14 on the DDC die 10. A method for fabricating the solder bumps 12 using electroless deposition and wave soldering will be hereinafter described.

Figure 2:
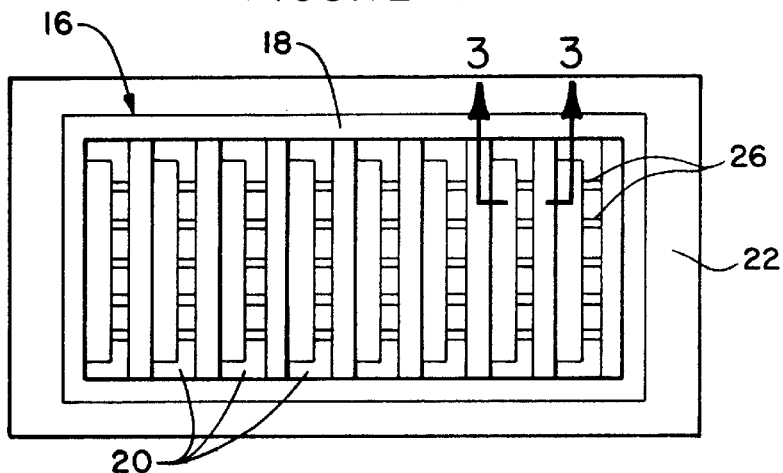
FIG. 2 is a schematic plan view of a semiconductor package constructed in accordance with the invention.
Figure 3:
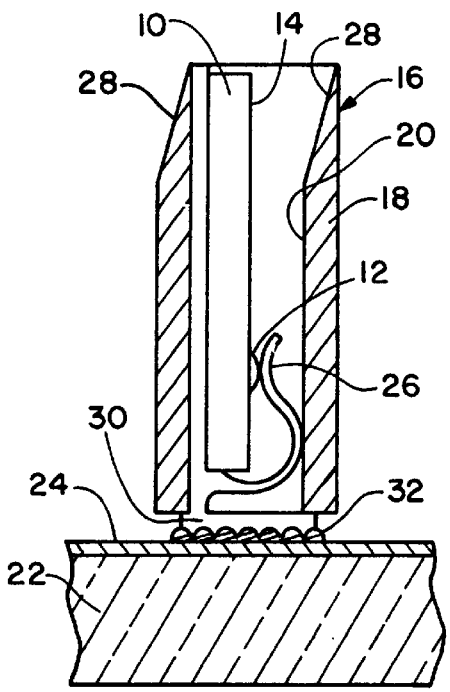
FIG. 3 is a cross sectional view taken along section line 3—3 of FIG. 2.

Referring to FIGS. 2 and 3, a semiconductor package 16 constructed in accordance with the invention comprises a housing 18 and multiple DDC dice 10. The housing 18 includes separate die receiving channels 20, each adapted to contain a single DDC die 10. The die receiving channels 20 include beveled sidewalls 28 (FIG. 3) to facilitate insertion of the DDC dice 10 into the die receiving channels 20.

The semiconductor package 16 is adapted for mounting to a supporting substrate 22 (FIG. 3), such as a printed circuit board or ceramic plate to form multi chip modules and other electrical components. The supporting substrate 22 can include patterns of conductors 24 adapted for electrical communication with the DDC dice 10 and other components of the multi chip module. Although the semiconductor package 16 comprises a multi chip module with multiple dice 10, the method of the invention can also be used to form a package having a single die.

As clearly shown in FIG. 3, each die receiving channel includes electrical connectors in the form of spring contacts 26. As will be more fully explained, during assembly of the package 16, the solder bumps 12 on the DDC dice 10 can be bonded to the spring contacts 26 using a reflow process. In addition to establishing electrical communication with the solder bumps 12, the spring contacts 26 can include a base 30 adapted for electrical communication with the conductors 24 on the supporting substrate 22. The base 30 can be bonded to the substrate 22 using solder 32. To facilitate soldering, the spring contacts 26 can be formed of a solderable metal such as beryllium copper, or "PALLINEY 7" available from J.M. Ney Company of Hartford, Conn.

For assembling the semiconductor package 16, the DDC dice 10 can be inserted into the channels 20 using an insertion tool or loading mechanism (not shown). With the DDC dice 10 completely inserted into the channels 20, the solder bumps 12 electrically engage the spring contacts 26. The spring contacts 26 can be formed to exert predetermined contact forces on the solder bumps 12. However, since the solder bumps 12 project from the passivation layer 14 on the face of the DDC dice 10, the spring contacts 26 can be formed to minimally contact the passivation layer 14 of the DDC dice 10 during insertion of the dice 10 into the channels 20. This helps to prevent damage to the passivation layer 14 and solder bumps 12 during assembly of the package 16.

Following insertion of the DDC dice 10 into the channels 20, the solder bumps 12 can be reflowed. This step can be performed using a "conveyor furnace" adapted to move the package 16 at a predetermined speed through different temperature zones. The temperature zones can include one or more preheat zones, a reflow zone and a cool down zone. Depending on the solder formulation, the reflow zone can be maintained at a peak temperature of from 40° C. to 80° C. above the melting temperature of the solder bumps 12. This temperature can be maintained for a time period of several minutes.

Reflowing the solder bumps 12 forms bonded metal to metal connections between the solder bumps 12 and the spring contacts 26. The bonded connections provide low resistance electrical paths and prevent movement and "fretting" of the spring contacts 26 with respect to the DDC dice 10. In addition, the bonded connections provided by the reflowed solder bumps 12 anchor the dice 10 within the package 16, and prevent movement of the dice 10 and spring contacts 26.

For removing one or more dice 10 from the package 16, the solder bumps 12 can be heated to reflow the solder, and loosen the bonded connections with the spring contacts 26. Because the spring contacts 26 can be shaped to exert minimal contact force, damage to the passivation layer 14 can be minimized during removal of the dice 10.

Solder Bump Fabrication

Referring to FIG. 4, steps in a method for fabricating the DDC die 10 (FIG. 1) with solder bumps 12 (FIG. 1) using electroless deposition and wave soldering are illustrated. The bump fabrication method includes the steps of:

- Providing a semiconductor die having metal electrodes, step A.
- Cleaning and activating the metal electrodes for subsequent electroless deposition, step B.
- Electrolessly depositing adherence layers on the activated metal electrodes, step C.
- Electrolessly depositing solder wettable layers on the adherence layers, step D.
- Depositing solder bumps on the solder wettable layers using a wave soldering apparatus, step E.

Figure 5A:
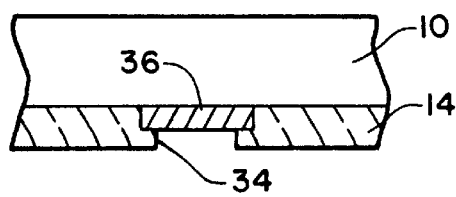
FIG. 5A is a schematic cross sectional view of an electrode for the DDC die during an activating step.

Referring to FIGS. 5A–5D and 6A–6D, a method for fabricating solder bumps 12 on metal electrodes 36 is schematically illustrated. Initially as shown in FIG. 5A, the semiconductor die 10 can be provided with the patterns of electrodes 36 embedded in the passivation layer 14. By way of example, the electrodes 36 can comprise thin film aluminum bond pads in electrical communication with aluminum metallization and integrated circuits formed on the DDC die 10. Typical aluminum bond pads have a thickness of from 1.0 to 1.5 $\mu$m. The passivation layer 14 can comprise a glass such as borophosphosilicate glass (BPSG), or phosphorous silicate glass (PSG), an oxide such as $SiO_2$, or a nitride, such as $Si_3N_4$. Openings 34 (FIG. 5A) can be provided in the passivation layer 14 to allow access to the electrodes 36.

The electrodes 36 can also be formed using additional metallization and passivation layers, as described in U.S. Pat. No. 5,593,927, entitled "Method For Packaging Semiconductor Dice", incorporated herein by reference. Using the method described in the cited patent, the electrodes 36 can be formed in a desired pattern in electrical communication with a standardized pattern of bond pads. For example, a die having bond pads along its center line can be modified using the method of the '927 patent with additional passivation and metallization layers.

As another example, the electrodes 36 can be formed by depositing an additional insulating layer on the dice 10, followed by screen printing or stenciling, of additional metallization in electrical communication with the standard device bond pads. This allows the electrodes 36 to be formed in desired locations as required, such as along an edge of the die 10, to accommodate the locations of the spring contacts 26 (FIG. 3).

As shown in FIG. 5A, in order to clean and activate the electrodes 36 for subsequent electroless deposition, the die 10 can be submerged in an activation bath 16. The activation bath contains an activation solution 40 at a temperature of from 20° C. to 40° C. In general, the activation solution 40 functions to strip native oxide layers present on the electrodes 36. One suitable activation solution includes a zincate, such as $ZnO_2$ or $Zn(OH_4)$. Zincate solutions are commercially available from Lea Ronal, as well as other manufacturers.

Figure 5B:
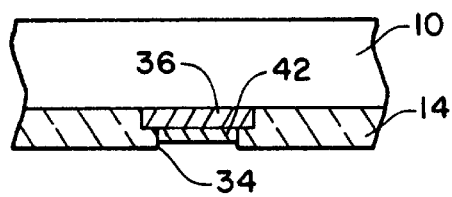
FIG. 5B is a schematic cross sectional view of the electrode illustrating deposition of an adherence layer on the electrode.
Figure 6A:
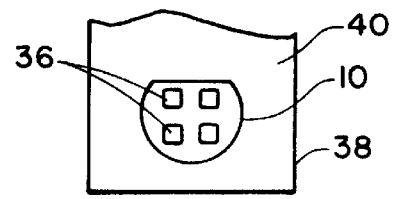
FIG. 6A is a schematic cross sectional view of an electroless plating tank configured to activate the electrodes.
Figure 6B:
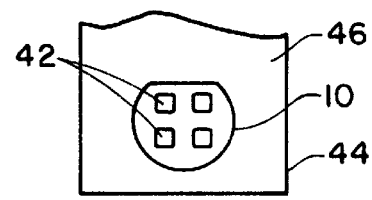
FIG. 6B is a schematic cross sectional view of an electroless plating tank configured to electrolessly deposit adherence layers on the electrodes.

Next, as shown in FIGS. 5B and 6B, adhesion metal layers 42 can be formed on the electrodes 36. Preferred materials for the adhesion metal layers 42 include Ni, Zn, Cr and Pd. An adhesion bath 44 (FIG. 6B) containing an adhesion metal solution 46 can be used to electrolessly deposit the adhesion metal layers 42 through the openings 34 in the passivation layer 14 onto the electrodes 36. For depositing nickel adhesion metal layers 42, a suitable adhesion metal solution 46 can include nickel chloride, sodium hydroxyacetate, and sodium hypophosphate at a temperature of about 85° to 90° C. A representative thickness for the adhesion metal layers 42 can be from 500 Å to 10 $\mu$m. This thickness can be achieved by controlling the concentration of the adhesion metal solution 46 and the time period during which the die 10 is submerged. A representative time period for submergence can be from 1 to 5 minutes.

Figure 5C:
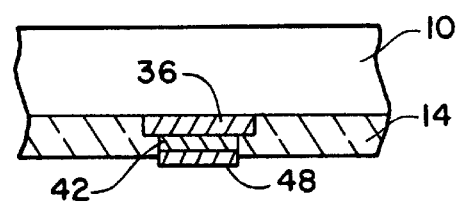
FIG. 5C is a schematic cross sectional view of the electrode illustrating deposition of a solder wettable layer on the adherence layer.
Figure 6C:
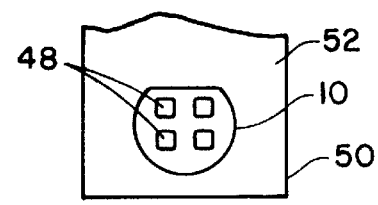
FIG. 6C is a schematic cross sectional view of an electroless plating tank configured to electrolessly deposit solder wettable layers on the adherence layers.

Next, as shown in FIGS. 5C and 6C, solder wettable layers 48 can be formed on the adhesion metal layers 42. Preferred metals for the solder wettable layers 48 include palladium and gold. As shown in FIG. 6C, a solder wettable bath 50 containing a solder wettable solution 52 can be used to electrolessly deposit the solder wettable layers 48 onto the adhesion metal layers 42. For depositing palladium solder wettable layers 48, a suitable solder wettable solution 52 includes palladium chloride and sodium hypophosphate at a temperature of about 50° to 60° C.

A representative thickness for the solder wettable layers 48 can be from 500 Å to 0.1 $\mu$m. This thickness can be achieved by controlling the concentration of the solder wettable solution 52 and the time period for which the die 10 is submerged. A representative time period for a 1 gm/liter solution of palladium chloride and sodium hypophosphate can be from 1 to 2 minutes.

Figure 5D:
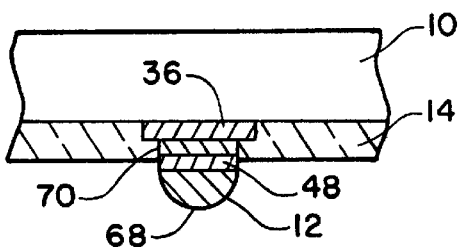
FIG. 5D is a schematic cross sectional view of the electrode illustrating formation of a solder bump on the solder wettable layer.
Figure 6D:
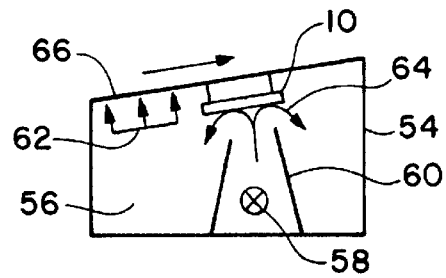
FIG. 6D is a schematic cross sectional view of a wave soldering apparatus configured to deposit solder bumps on the solder wettable layers.

Next, as shown in FIGS. 5D and 6D, the solder bumps 12 can be deposited on the solder wettable layers 48 using a wave soldering apparatus 54. The wave soldering apparatus 54 can include a tank with molten solder 56 formulated as required. Suitable formulations include 95% Pb/5% Sn, 60% Pb/40% Sn, 63% In/37% Sn, 100% Sn, 62% Pb/36% Sn/2% Au. A representative temperature for the molten solder 56 can be from 180° C. to 260° C. As shown in FIG. 6D, the wave soldering apparatus 54 can also include a pump 58 and baffles 60 configured to produce a turbulent solder wave 64. A conveyor 66 can be used to move the die 10 past the solder wave 64. In addition, a heater element 62 can be used to preheat the die 10 prior to exposure to the solder wave 64. One suitable wave soldering apparatus 54 is available from Electrovat of Montreal, Canada and is designated a model no. 605C.

Figure 7:
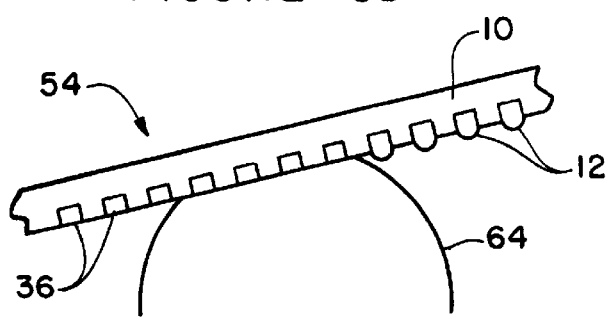
FIG. 7 is an enlarged schematic view of a portion of the wave soldering apparatus illustrating formation of the solder bumps on the electrolessly deposited layers.

As shown in FIG. 7, using the wave soldering apparatus 54, the solder bumps 12 deposit onto the electrodes 36, as the die 10 is moved proximate to the solder wave 64. The solder wettable layers 48 (FIG. 5C) on the electrodes 36 provide surfaces for attracting solder and building the solder bumps 12. In particular with the solder wettable layers 48 formed of palladium, or other material having an affinity for solder, the solder is attracted to the surfaces of the wettable layers 48. In addition, the process is self aligning in that only the exposed surfaces of the solder wettable layers 48 are plated with solder. With some materials the solder wettable layers 48 will be partially or totally consumed by reaction with the solder. In particular, palladium combines with solder so that the deposited solder bumps 12 can include microscopic spheres of pure palladium embedded in a Pb—Sn matrix.

As shown in FIG. 5D, the solder bumps 12 can be generally hemispherical in shape, with generally convex sidewalls 70 and a rounded tip portion 68. A representative height of the solder bumps 12 can be from 1 mils to 5 mils. A diameter of the solder bumps 12 can be determined by the bond pad size and geometry of the electrodes 36 (FIG. 5A) with 2 to 20 mils being representative. The geometry of the solder bumps 12 can also be controlled by the orientation of the die 10 with respect to the solder wave 64, by the temperature of the solder wave 64 (e.g., above, below, angle etc.), and by the speed of the conveyor 66. In general, increased temperatures and higher speeds of the conveyor 66 produce taller solder bumps 12.

Alternate Embodiment (Conductive Adhesive Bumps)

Figure 3A:
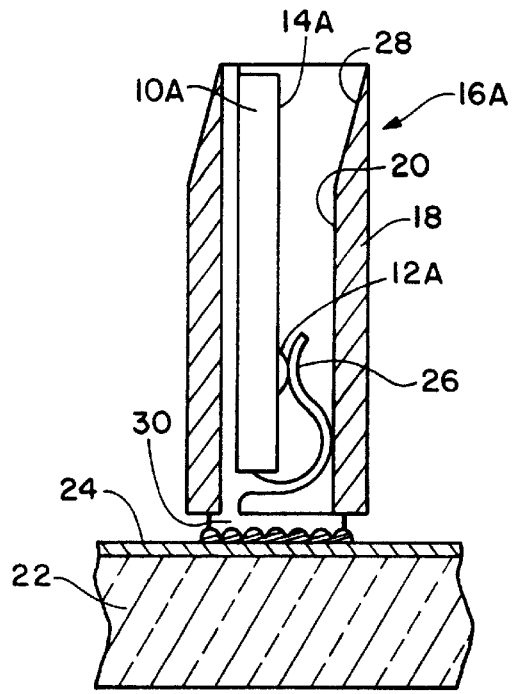
FIG. 3A is a schematic cross sectional view equivalent to FIG. 3 of an alternate embodiment semiconductor package having conductive adhesive contacts.

Referring to FIG. 3A, an alternate embodiment semiconductor package 16A includes DDC dice 10A having conductive adhesive bumps 12A. One type of conductive adhesive suitable for forming the conductive adhesive bumps 12A comprises a "z-axis anisotropic adhesive". Z-axis anisotropic adhesives are filled with conductive particles to a low level such that the particles do not contact each other in the xy plane. Compression of the material in the z direction establishes an electrical path.

Z-axis anisotropic adhesives can be formed as a viscous paste, or as a film that is applied and then cured to harden. Both types of z-axis anisotropic adhesives (paste or film) come in a thermal plastic or thermal setting variety. Thermal plastic anisotropic adhesives are heated to soften for use and then cooled for curing. Thermal setting anisotropic adhesives require heat curing at temperatures from 100–300° C. for from several minutes to an hour or more. Suitable z-axis anisotropic adhesives are sold under the trademarks: "X-POLY" and "z-POXY", by A.I. Technology, Trenton, N.J.; and "SHELL-ZAC", by Sheldahl, Northfield, Minn. Z-axis anisotropic adhesives are also sold by 3M, St. Paul, Minn. The conductive adhesive material can be applied to the bond pads of a conventional semiconductor die to form the conductive adhesive bumps 12A. Alternately, electrodes equivalent to the electrodes 36 (FIG. 5A) previously described can be fabricated in desired configuration using the previously cited '927 patent.

The conductive adhesive bumps 12A in addition to forming electrically conductive paths to the spring contacts 26 can also provide a compliant member for contact with the spring contacts 26. In particular some conductive adhesive formulations possess resilient characteristics. In addition, ;the conductive adhesive bumps 12A can be formed with a height that allows the spring contacts 26 to minimally contact the passivation layer 14A of the DDC dice 10A during insertion of the dice 10A into the die receiving channels 20. The size and diameters of the conductive adhesive bumps 12A can be as previously explained for the solder bumps 12.

The conductive adhesive bumps 12A can also be configured to form bonded connections to the spring contacts 26. In this case the conductive adhesive bumps 12A can be in a semi-cured, or B-stage condition, during insertion of the DDC dice 10A into the channels 28. Complete curing of the conductive adhesive bumps 12A can be performed after the bumps 12A have been placed into contact with the spring contacts 26. The spring contacts 26 can thus apply a compressive force to the conductive adhesive bumps 12A during curing.

Alternate Embodiment (Chip Scale Package)

Figure 8A:
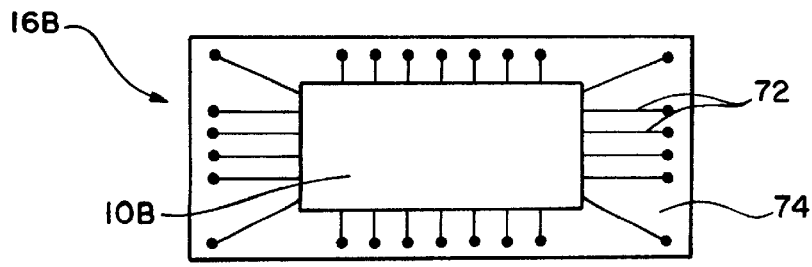
FIG. 8A is an enlarged schematic plan view of a chip scale package constructed in accordance with the invention.
Figure 8B:
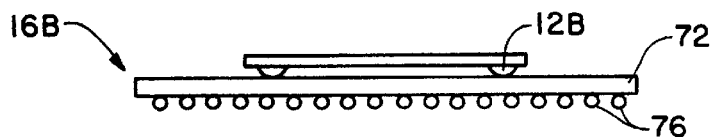
FIG. 8B is a side elevation view of FIG. 8A.

Referring to FIGS. 8A and 8B, a DDC die 10B having solder bumps 12B fabricated substantially as previously described for die 10 (FIG. 1) is illustrated. However, in this embodiment the DDC die 10B can be used to fabricate a chip scale package 16B. The chip scale package 16B includes a fan out substrate 72 to which the DDC die 10B can be flip chip bonded. The fan out substrate 72 can be formed of an electrically insulating material such as ceramic or FR-4. In addition, the fan out substrate 72 can include patterns of conductors 74 formed on a first surface (face) thereof in electrical communication with ball contacts 76 on an opposing surface (back side) thereof.

Preferably the ball contacts 76 can be arranged in a dense array such as a ball grid array (BGA). Alternately in place of ball contacts 76 in a BGA, other dense configurations of external contacts such as pins in a pin grid array (PGA), or pads in a land grid array (LGA) can be used.

The solder bumps 12B can be aligned and bonded to bonding sites on the conductors 74 using an aligner bonder tool or other techniques known in the art. A suitable aligner bonder tool is manufactured by Research Devices, Inc. of Piscataway, N.J.

Alternate Embodiment (Temporary Package)

Figure 9A:
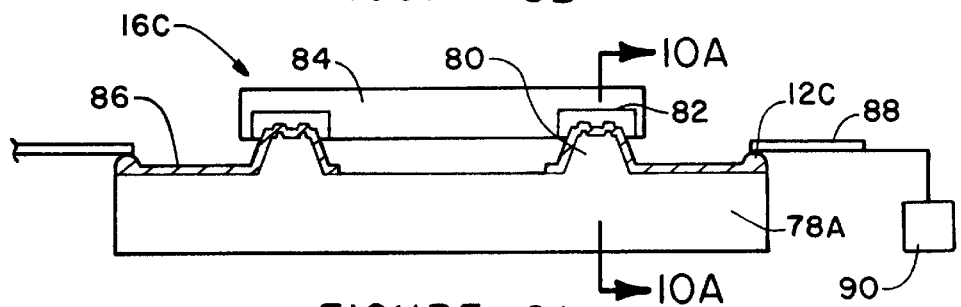
FIG. 9A is a schematic cross sectional view of a temporary package constructed in accordance with the invention.
Figure 10B:
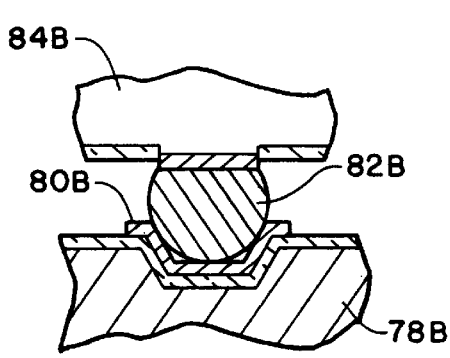
FIG. 10B is an enlarged cross sectional view taken along section line 10B—10B of FIG. 9B.
Figure 10A:
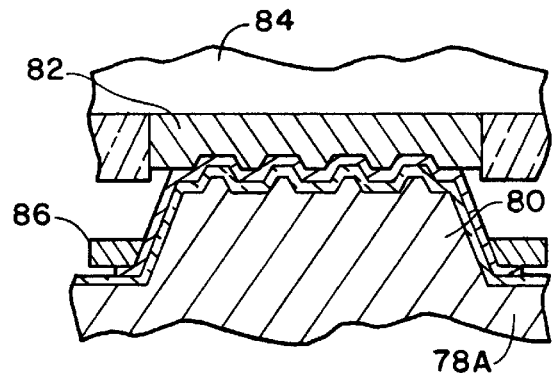
FIG. 10A is an enlarged cross sectional view taken along section line 10A—10A of FIG. 9A.

Referring to FIGS. 9A and 10A, solder bumps 12C can be fabricated substantially as previously described on an interconnect 78A for a temporary package 16C. As shown in FIG. 10A, the interconnect 78A can include contact members 80 adapted to establish temporary electrical communication with contact locations 82 (e.g., bond pads) on a semiconductor die 84 for testing. With the exception of the solder bumps 12C, the interconnect 78A can be fabricated substantially as described in U.S. Pat. No. 5,483,741, entitled "Method For Fabricating A Self Limiting Silicon Based Interconnect For Testing Bare Semiconductor Dice", incorporated herein by reference. The temporary package 16C can be fabricated substantially as described in U.S. Pat. No. 5,519,332, entitled "Carrier For Testing An Unpackaged Semiconductor Die", incorporated herein by reference.

The interconnect 78A can include patterns of conductors 86 in electrical communication with the contact members 80. The solder bumps 12C can be formed on bonding sites on the conductors 86 using electroless deposition and wave soldering as previously described for solder bumps 12 (FIG. 5D). In addition, the temporary package 16C can include electrical connectors 88 in electrical communication with test circuitry 90. By way of example, the electrical connectors 88 can be metal tines, or laminated conductors formed on a multi layered tape similar to TAB tape. The solder bumps 12C can be bonded to the electrical connectors 88 using a reflow process substantially as previously described for solder bumps 12. The bonded connections provided by the solder bumps 12C provide low resistance electrical paths for high speed testing of the die 84.

Figure 9B:
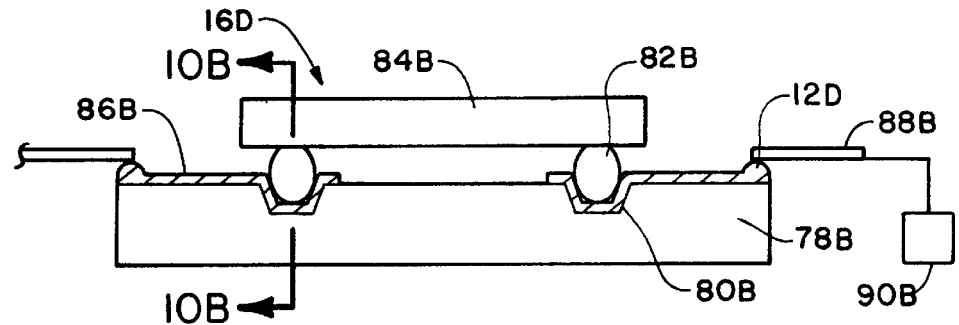
FIG. 9B is a schematic cross sectional view of an alternate embodiment temporary package.

Referring to FIGS. 9B and 10B, an interconnect 78B includes solder bumps 12D fabricated using electroless deposition and wave soldering as previously described. However, in this embodiment, the interconnect 78B can be a component of a temporary package 16D adapted to test semiconductor dice 84B having raised contact locations 82B (e.g., bumped bond pads). With the exception of the solder bumps 12D, the interconnect 78B and temporary package 16D can be fabricated substantially as described in U.S. patent application Ser. No. 08/818,456 entitled "Direct Connect Interconnect For Testing Semiconductor Dice And Wafers", incorporated herein by reference. As with the previous temporary package 16C (FIG. 9A), the solder bumps 12D can be bonded to electrical connectors 88B on the temporary package 16D in electrical communication with test circuitry 90B.

Alternate Embodiment (Multi Chip Module)

Referring to FIGS. 11–11E, a multi chip module 94 constructed in accordance with the invention includes multiple DDC dice 10M and a supporting substrate 94. The DDC dice 10M include solder bumps 12M (FIG. 12M) and pads 102 (FIG. 12M) fabricated using electroless deposition and wave soldering, substantially as previously described. In addition, the supporting substrate 94 includes bumped electrodes 96 (FIG. 11A) and pads 108 fabricated using electroless deposition and wave soldering, substantially as previously described. The bumped electrodes 96 (FIG. 11A) are fabricated in patterns that match the patterns of the solder bumps 12M (FIG. 11A) on the DDC dice 10M.

The bumped electrodes 96 and solder bumps 12M can be formed of the solder alloys previously described. However, preferably the bumped electrodes 96 and the solder bumps 12M comprise different solder alloys having different melting temperatures. For example, one of the solder alloys can be a high temperature alloy, such as 95%Pb/5%Sn, and the other solder alloy a low temperature eutectic alloy, such as 63%Pb/37%Sn. Some low temperature solders have a melting temperature of about 180° C.–190° C., whereas some high temperature solders have a melting temperature of about 260° C.–280° C. As will be further explained, the different melting temperatures aid in the subsequent assembly of the multi chip module 94. In the illustrative embodiment the solder bumps 12M are formed of a high temperature solder alloy, and the bumped electrodes 96 are formed of a low temperature solder alloy.

The supporting substrate 94 can be formed of a rigid material such as silicon, ceramic or FR-4. In addition, the supporting substrate 94 can include an alignment member 98 (FIG. 11A). The alignment member 98 can comprise a plate formed separately of a material, such as silicon, ceramic, or FR-4, and then attached to the supporting substrate 94. Alternately, the alignment member can comprise a deposited, patterned and cured polymer.

In the illustrative embodiment, the alignment member 98 comprises a patterned and cured layer of resist. One suitable resist for forming the alignment member 98 comprises a negative tone resist, blanket deposited to a desired thickness, exposed, developed and then cured. A suitable resist formulation is sold by Shell Chemical under the trademark "EPON RESIN SU-8". Such a resist can be deposited to a thickness of from about 5–50 mils. A conventional resist coating apparatus, such as a spin coater, can be used to deposit the resist onto the supporting substrate 94. The deposited resist can then be "prebaked" at about 95° C. for about 15 minutes and exposed in a desired pattern using a conventional UV aligner with a dose of about 165 mJ/cm². Developing can be accomplished with a solution of PGMEA (propylenglycol-monomethylether-acetate). This can be followed by a hard bake at about 200° C. for about 30 minutes.

As shown in FIG. 11A, the alignment member 98 includes patterns of alignment openings 104. Each alignment opening 104 is sized and shaped to contact the peripheral edges of a DDC die 10M. This aligns the DDC dice 10M on the substrate 94, and provides alignment of the contact bumps 12M to the bumped electrodes 96. Alternately alignment can be performed using a vision alignment system such as an aligner-bonder used for flip chip bonding conventional semiconductor dice to circuit boards. One suitable aligner bonder is sold by Research Devices Inc. of Piscataway, N.J.

In FIG. 11B the DDC die 10M has been aligned by the alignment member 98 so that the solder bumps 12M are in physical contact with the bumped electrodes 96. FIG. 11D is an enlarged view showing the physical contact between the contact bumps 12M and the bumped electrodes 96.

Following the alignment step, and as shown in FIG. 11C, the solder bumps 12M and bumped electrodes 96 can be reflowed to form bonded connections 106. As previously stated, the solder bumps 12M can be formed of a high melting temperature alloy whereas the bumped electrodes 96 can be formed of a low melting temperature alloy. Accordingly, the temperature of the reflow process can be maintained at a temperature between the different melting temperatures. This allows the solder bumps 12M to soften but not enter the liquid phase. The softened solder bumps 12M have a structural rigidity that prevents collapse of the die 10M onto the supporting substrate 94. On the other hand, the bumped electrodes 96 liquefy and flow into the solder bumps 12M to form the bonded connections 106 (FIG. 11E). This process is self aligning in that the liquidified bumped electrodes 96 are attracted to the softened solder bumps 12M. Following the reflow process the bonded connections 106 cool and harden into a rigid solder joint.

Referring to FIG. 12A, a conveyorized furnace 110. which can be used to perform the reflow-bonding process, is shown. The conveyorized furnace 110 includes a conveyor 112 adapted to move the DDC die 10M and supporting substrate 94 assembled as shown in FIG. 11B through four different temperature zones 1–4. Zones 1 and 2 can be maintained at pre-heat temperatures (e.g., 0–150° C.). Zone 3 can be maintained at a temperature above the melting point of the bumped electrodes 96, but below the melting point of the solder bumps 12M (e.g., 180° C. to 260° C.). Zone 4 can be maintained at a cool-down temperature (e.g., 50° C. to 100° C.). FIG. 12B illustrates a representative temperature versus time profile for the reflow process. In general, the conveyorized furnace 110 can be configured so that the preheating occurs in the first three minutes, reflowing occurs during the next four minutes, and cooling occurs during the final three minutes. Although the illustrative embodiment is with a conveyorized furnace, the reflow process can also be performed using a heated vapor phase reflow process.

In addition, to the above described semiconductor packages, the method of the invention can be employed to fabricate other types of package. Another package that can include solder bumps formed in accordance with the invention is described in U.S. patent application Ser. No. 08/563,191, entitled "Method Of Producing A Single Piece Package For Semiconductor Die", incorporated herein by reference.

Thus the invention provides improved semiconductor packages and methods for fabricating solder bumps for semiconductor dice, packages and interconnects. The method is characterized by low temperatures and simple process steps. In addition, masks and stencils are not required for locating the solder bumps.

While the invention has been described with reference to certain preferred embodiments, as will be apparent to those skilled in the art, certain changes and modifications can be made without departing from the scope of the invention as defined by the following claims.

What is claimed is:

1. A method for fabricating a semiconductor package comprising:

providing a semiconductor die comprising a face, a passivation layer on the face, and a plurality of electrodes on the face;

fabricating solder bumps on the electrodes by electrolessly depositing adhesion layers on the electrodes and moving the die proximate to a molten solder wave to deposit solder onto the adhesion layers;

providing a housing for retaining the die comprising a channel, a plurality of electrical connectors in the channel configured for bonding to the solder bumps, wherein the solder bumps and the electrical connectors are configured to allow placing of the die in the channel, and to allow contact of the electrical connectors and the solder bumps during placing of the die in the channel without damaging a passivation layer formed on an outer surface of the die;

placing the die in the channel with the solder bumps contacting the electrical connectors;

reflowing the solder bumps to form bonded connections with the electrical connectors to anchor the die in the channel and prevent movement of the electrical connectors.

2. The method of claim 1 wherein the electrical connectors comprise spring contacts extending into the channel and configured to compress the solder bumps.

3. The method of claim 1 wherein the electrodes comprise aluminum and the adhesion layers comprise a metal selected from the group consisting of Ni, Zn, Cr and Pd.

4. A method for fabricating a semiconductor package comprising:

providing a semiconductor die comprising a face, an outer layer on the face, and a plurality of electrodes on the face;

electrolessly depositing adhesion layers on the electrodes;

forming solder bumps on the adhesion layers by moving the die through a molten solder proximate to a molten solder wave;

providing a housing comprising a channel for receiving the die and a plurality of electrical connectors within the channel configured for bonding to the solder bumps;

placing the die within the channel with the solder bumps contacting the electrical connectors, wherein a geometry of the solder bumps and a shape of the electrical connectors are selected to allow contact of the electrical connectors and the solder bumps during the placing step without damage to the outer layer; and reflowing the solder bumps to form bonded connections with the electrical connectors to anchor the die within the housing and prevent movement of the electrical connectors.

5. The method of claim 4 further comprising controlling the geometry of the solder bumps by selection of an orientation of the die relative to the solder wave, by selection of a temperature of the molten solder, and by selection of a speed with which the die moves through the molten solder.

6. The method of claim 4 wherein reflowing the solder bumps comprises placing the housing and the die within a conveyor furnace.

7. A method for fabricating a semiconductor package comprising:

providing a semiconductor die comprising a plurality of electrodes;

electrolessly depositing first metal layers on the electrodes;

depositing solder bumps on the first metal layers by moving the die through a molten solder proximate to a molten solder wave;

controlling a geometry of the solder bumps by selection of an orientation of the die relative to the solder wave, by selection of a temperature of the molten solder, and by selection of a speed with which the die moves through the molten solder;

providing a housing comprising a channel for retaining the die and a plurality of electrical connectors within the channel for electrically contacting the solder bumps, the connectors comprising a solderable metal configured for bonding to the solder bumps;

placing the die within the channel with the solder bumps contacting the electrical connectors, wherein the geometry of the solder bumps and a shape of the electrical connectors are selected to permit contacting of the solder bumps during the placing step without damaging the die; and reflowing the solder bumps to bond the solder bumps to the electrical connectors and prevent movement of the die and the electrical connectors.

8. The method of claim 7 wherein the housing comprises a plurality of channels and the package comprises a plurality of semiconductor dice.

9. The method of claim 7 wherein the electrical connectors comprise copper or beryllium copper.

10. A method for fabricating a semiconductor package comprising:

providing a semiconductor die comprising a plurality of electrodes;

forming a plurality of raised contacts on the electrodes by depositing a conductive adhesive material thereon;

partially curing the conductive adhesive material to a B-stage condition;

providing a housing comprising a channel for retaining the die and a plurality of electrical connectors extending into the channel, the electrical connectors configured to contact and compress the raised contacts, without damaging an outer surface of the die;

placing the die within the channel with the electrical connectors compressing the raised contacts; and following the placing step, curing the conductive adhesive material under compression from the electrical connectors, to bond the raised contacts to the electrical connectors, and to form electrically conductive paths therebetween.

11. The method of claim 10 wherein the partially curing step and the curing step comprise heating the conductive adhesive material.

12. The method of claim 10 wherein the raised contacts have a height, and the electrical connectors have a shape, selected to allow the placing step to be performed without damage to the die.

13. The method of claim 10 wherein the conductive adhesive material comprises an anisotropic adhesive.

14. A method for fabricating a semiconductor package comprising:

providing a semiconductor die comprising a plurality of electrodes;

forming a plurality of contacts on the electrodes comprising a conductive adhesive;

partially curing the contacts to a B-stage condition;

providing a housing comprising a channel configured to retain the die and a plurality of electrical connectors in the channel configured to contact and compress the contacts, the raised contacts and the electrical connectors configured to permit placing of the electrical connectors on the raised contacts without damage to the die;

placing the die within the channel with the electrical connectors compressing the contacts; and bonding and electrically connecting the contacts to the electrical connectors by curing the conductive adhesive under compression from the electrical connectors.

15. The method of claim 14 wherein partially curing the contacts comprises heating the conductive adhesive.

16. The method of claim 14 wherein curing the conductive adhesive comprises heating the die and the conductive adhesive.

17. The method of claim 14 wherein curing the conductive adhesive comprises cooling the conductive adhesive and the die.

18. The method of claim 14 wherein the conductive adhesive comprises an anisotropic adhesive.

19. The method of claim 14 wherein the conductive adhesive comprises a resilient material.

20. The method of claim 14 wherein the electrical connectors comprise spring contacts sized and shaped to minimally contact a face of the die.

* * * * *